(12) United States Patent
Yoon et al.

(10) Patent No.: US 6,815,257 B2
(45) Date of Patent: Nov. 9, 2004

(54) CHIP SCALE PACKAGE AND METHOD OF FABRICATING THE SAME

(75) Inventors: Joon Ho Yoon, Seoul (KR); Yong Chil Choi, Suwon (KR); Suk Su Bae, Changwon (KR)

(73) Assignee: Samsung Electro-Mechanics Co., Ltd. (KR)

( * ) Notice: Subject to any disclaimer, the term of this patent is extended or adjusted under 35 U.S.C. 154(b) by 0 days.

(21) Appl. No.: 10/329,519

(22) Filed: Dec. 27, 2002

(65) Prior Publication Data

US 2003/0173577 A1 Sep. 18, 2003

(30) Foreign Application Priority Data

Mar. 18, 2002 (KR) ........................................ 2002-14572

(51) Int. Cl.[7] .............................................. H01L 21/44
(52) U.S. Cl. ...................................... 438/113; 438/110
(58) Field of Search ................................. 438/113, 110, 438/421, 108, 462

(56) References Cited

U.S. PATENT DOCUMENTS 6,204,089 B1   3/2001  Wang
6,300,686 B1  10/2001  Hirano et al.
6,492,198 B2 * 12/2002  Hwang ........................ 438/108

\* cited by examiner

*Primary Examiner*—Douglas Willie
(74) *Attorney, Agent, or Firm*—Lowe Hauptman Gilman & Berner LLP

(57) ABSTRACT

Disclosed are a chip scale package and a method of fabricating the chip scale package. The chip scale package comprises an insulating layer formed on the upper surface of a chip provided with a plurality of terminals on its one surface, a plurality of conductive layers formed on the insulating layer and spaced from each other by a designated distance so as to be connected to each of a plurality of the terminals, and a plurality of electrode surfaces formed on each of the upper surfaces of a plurality of the conductive layers. The chip scale package is miniaturized in the whole package size. Further, the method of fabricating the chip scale package does not require a wire-bonding step or a via hole forming step, thereby simplifying the fabrication process of the chip scale package and improving the reliability of the chip scale package.

21 Claims, 6 Drawing Sheets

CHIP SCALE PACKAGE AND METHOD OF FABRICATING THE SAME

BACKGROUND OF THE INVENTION

1. Field of the Invention

The present invention relates to a chip scale package, and more particularly to a miniaturized chip scale package, which comprises a chip type device having a plurality of terminals on its one surface, and a method of fabricating the chip scale package.

2. Description of the Related Art

Generally, semiconductor devices such as transistors are packaged and these packaged devices are then mounted on a printed circuit board. Structurally, this package easily connects terminals of the semiconductor device to corresponding signal patterns of the printed circuit board and serves to protect the semiconductor device from external stresses, thereby improving reliability of the package.

In order to satisfy recent trends of miniaturization of semiconductor products, the semiconductor chip packages also have been miniaturized. Therefore, a chip scale package (also, referred to as a "Chip Size Package") has been introduced.

FIG. 1 is a schematic cross-sectional view of a conventional chip scale package. The structure of the chip scale package 10 of FIG. 1 employs a ceramic substrate 1 and is a diode package with two terminals.

With reference to FIG. 1, two via holes, i.e., a first via hole 2a and a second via hole 2b, are formed on the ceramic substrate 1. The first and the second via holes 2a and 2b are filled with a conductive material so as to electrically connect the upper surface of the substrate 1 to the lower surface of the substrate 1. Then, a first and a second upper conductive lands 3a and 3b are formed on the upper surfaces of the first and the second via holes 2a and 2b, respectively. A first and a second lower conductive lands 4a and 4b are formed on the lower surfaces of the first and the second via holes 2a and 2b, respectively. The second upper conductive land 3b is directly connected to a terminal formed on the lower surface of the diode 5, i.e., a mounting surface of the diode 5 on a printed circuit board, and the first upper conductive land 3a is connected to the other terminal formed on the upper surface of the diode 5 by a wire 7. A molding part 9 using a conventional resin is formed on the upper surface of the ceramic substrate 1 including the diode 5 in order to protect the diode 5 from the external stresses. Thereby, the manufacture of the package 10 is completed.

FIG. 2 is a cross-sectional view of a conventional chip scale package assembly, in which the chip scale package is mounted on the printed circuit board.

As shown in FIG. 2, the manufactured diode package 10 is mounted on the printed circuit board 20 by a reflow soldering. That is, the diode package 10 is mounted on the printed circuit board 20 by arranging the lower conductive lands 4a and 4b of the package 10 on the corresponding signal patterns of the printed circuit board 20 and by then connecting the lower conductive lands 4a and 4b to the signal patterns of the printed circuit board 20 with a solder 15.

As shown in FIGS. 1 and 2, since the chip usually has a terminal on each of its two opposite surfaces, these terminals must be interconnected by wires. However, these wires require a large space on the upper surface of the chip, thereby increasing the overall height of the package. Further, since at least two via holes, corresponding to the number of terminals of the diode, must be formed on the ceramic substrate, an area as large as the total diameters of the via holes is further required. Moreover, in order not to connect the conductive lands formed on the upper and the lower surfaces of the via holes to each other, the conductive lands must be spaced from each other by a minimum interval. Therefore, the substrate has a large size so as to satisfy the aforementioned conditions, and the size of the substrate imposes a limit in miniaturizing the package.

The above-described diode has two terminals, each formed on the upper and the lower surfaces. However, an Integrated Circuit (IC) chip having a plurality of terminals on its one surface further requires a wire bonding step or employs a proper lead frame in order to interconnect the terminals to each other. That is, devices such as the IC chips have a plurality of terminals, thereby incurring a difficulty in miniaturizing the package including the device and complicating the fabrication process of the package.

Further, the substrate, which is employed by the above-described package, is a lead frame, a printed circuit board, or a ceramic substrate. These substrates are high-priced, thereby increasing the production cost of the package. Moreover, the conventional fabrication process of the package requires a wire-bonding step and a molding step as well as a die-bonding step, thereby being very complicated.

Accordingly, a packaging technique, which can minimize the size of the package and simplify its fabricating process, has been demanded.

SUMMARY OF THE INVENTION

Therefore, the present invention has been made in view of the above problems, and it is an object of the present invention to provide a chip scale package, which is miniaturized and more simply fabricated, by forming an insulating layer on the upper surface of a chip except for terminal areas, by forming conductive layers on the insulating layer, and by forming electrode surfaces on the conductive layer so as to be connected to corresponding connection pads of a printed circuit board, thereby improving the reliability of the package.

It is another object of the present invention to provide a chip package assembly with an innovative mounting method according to the structure of the chip scale package.

It is a yet another object of the present invention to provide a method of fabricating the chip scale package.

In accordance with one aspect of the present invention, the above and other objects can be accomplished by the provision of a chip scale package comprising a chip having a plurality of terminals on its one surface, an insulating layer formed on the surface of the chip except for a plurality of terminal areas, a plurality of conductive layers formed on the insulating layer and spaced from each other by a designated distance so as to be connected to each of a plurality of the terminals, and a plurality of electrode surfaces formed on each of the upper surfaces of a plurality of the conductive layers.

In accordance with another aspect of the present invention, there is provided a chip scale package assembly comprising a chip scale package and a printed circuit board. The chip scale package comprises a chip having a plurality of terminals on its one surface, an insulating layer formed on the surface of the chip except for a plurality of terminal areas, a plurality of conductive layers formed on the insulating layer and spaced from each other by a designated distance so as to be connected to each of a plurality of the terminals, and a plurality of electrode surfaces formed on each of the upper surfaces of a plurality of the conductive layers. The printed circuit board comprises a plurality of connection pads for being connected to each of the electrode surfaces of the chip scale package, and circuit patterns connected to each of the connection pads.

In accordance with yet another aspect of the present invention, there is provided a method of fabricating a chip scale package, comprising the steps of preparing a wafer including a plurality of chips, each chip including a plurality of terminals on its one surface, forming an insulating layer on the upper surface of the wafer except for areas for forming the terminals, forming a conductive layer on the upper surface of the insulating layer so as to be connected to a plurality of the terminals, forming an electrode surface on the upper surface of the conductive layer, dividing the upper conductive layer formed on the insulating layer into two plural parts so as to connected to each of a plurality of the terminals, and dicing the wafer into a plurality of package units.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, preferred embodiments of the present invention will be described in detail with reference to the annexed drawings.

Figure 1:
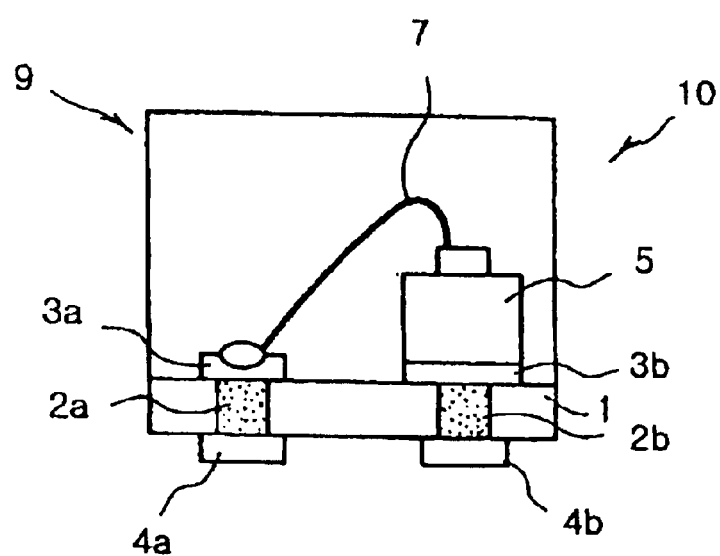
FIG. 1 is a schematic cross-sectional view of a conventional chip scale package.
Figure 2:
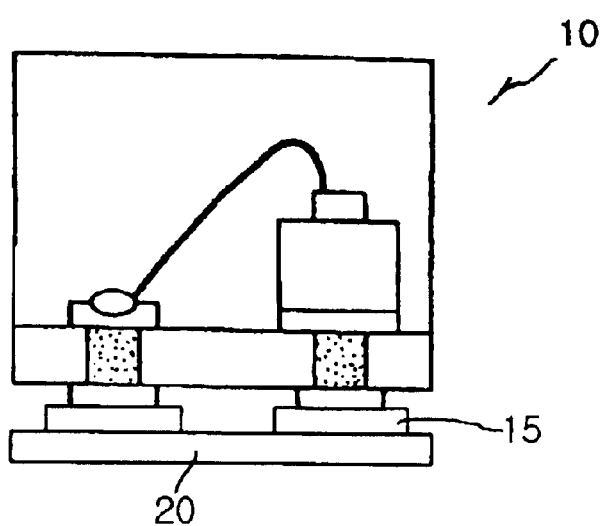
FIG. 2 is a cross-sectional view of a conventional chip scale package assembly, in which the chip scale package is mounted on a printed circuit board.
Figure 3A:
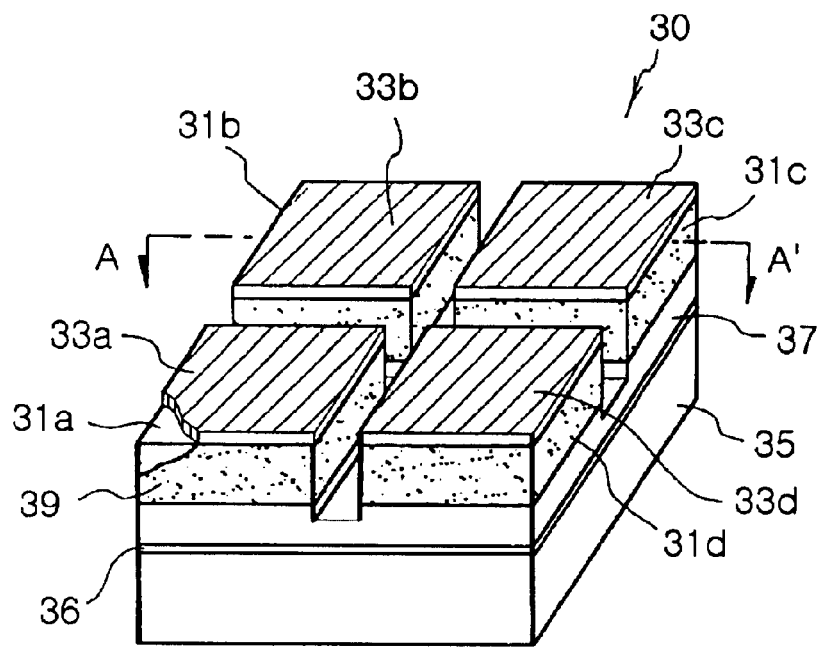
FIGS. 3a and 3b are a perspective view and a cross-sectional view of a chip scale package in accordance with a preferred embodiment of the present invention.
Figure 3B:
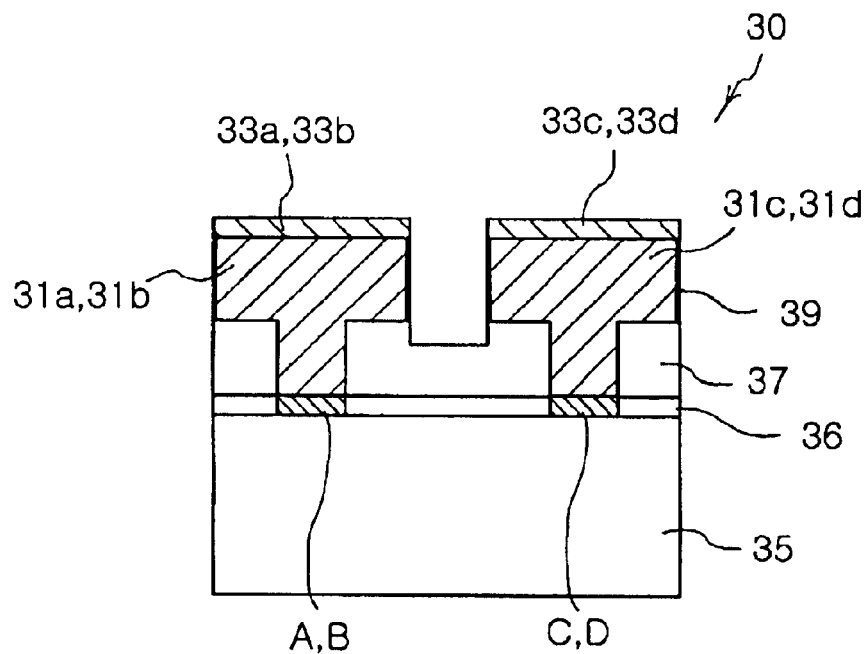

FIGS. 3a and 3b are a perspective view and a cross-sectional view of a chip scale package in accordance with a preferred embodiment of the present invention.

With reference to FIG. 3a, a chip scale package 30 comprises a chip 35 having four terminals (not shown) on its one surface. The chip scale package 30 further comprises an insulating layer 37 formed on the chip 35, four conductive layers 31a, 31b, 31c, and 31d formed on the upper surface of the insulating layer 33 and connected to each of four terminals, and four electrode surfaces 33a, 33b, 33c, and 33d formed on each of the upper surfaces of the conductive layers 31a, 31b, 31c, and 31d. Not shown in FIG. 3a, four terminals are formed on the upper surface of the chip 35 of the preferred embodiment of the present invention. However, the number of terminals of the chip is not limited thereto. That is, the number of terminals of the chip may be variously modified. The aforementioned chip 35 may be a conventional integrated circuit chip having a plurality of terminals on its one surface.

FIG. 3b describes the structure of the chip scale package 30 of the present invention in more detail. With reference to FIGS. 3a and 3b, the chip 35 comprises four terminals A, B, C, and D. The insulating layer 37 is formed on the upper surface of the chip 35 except for areas for four terminals A, B, C, and D. Generally, as shown in FIG. 3b, the terminal areas are formed by covering a mask pattern 36 with a plurality of windows on the upper surface of the chip 35 and by depositing metallic material on exposed terminal areas of the chip 35 through the windows of the mask pattern 36. Therefore, the insulating layer 37 is formed on the mask pattern 36.

Four conductive layers, i.e., the first, the second, the third, and the fourth conductive layers 31a, 31b, 31c, and 31d are formed on the upper surface of the insulating layer 37. The first, the second, the third, and the fourth conductive layers 31a, 31b, 31c, and 31d are connected to each of four terminals A, B, C, and D of the upper surface of the chip 35. The first, the second, the third, and the fourth conductive layers 31a, 31b, 31c, and 31d are spaced from each other by a designated distance. Preferably, the first, the second, the third, the fourth conductive layers 31a, 31b, 31c, and 31d are metal layers made of copper (Cu), but are not limited thereto. In order to connect the first, the second, the third, and the fourth conductive layers 31a, 31b, 31c, and 31d to each of four terminals A, B, C, and D, preferably, cavities of the insulating layer 37 are filled by a plating method. However, more preferably, a thin plating layer is formed by an electroplating method and at least one copper layer is stacked on the plating layer, thereby having a designated thickness.

The first, the second, the third, and the fourth electrode surfaces 33a, 33b, 33c, and 33d are formed on each of the upper surfaces of the first, the second, the third, and the fourth conductive layers 31a, 31b, 31c, and 31d. The first, the second, the third, and the fourth electrode surfaces 33a, 33b, 33c, and 33d serve to be electrically and mechanically connected to corresponding connection pads of a printed circuit board. Therefore, preferably, the first, the second, the third, and the fourth electrode surfaces 33a, 33b, 33c, and 33d are metal layers including gold (Au) with an excellent electric conductivity as so to subsequently perform the soldering between the first, the second, the third, and the fourth electrode surfaces 33a, 33b, 33c, and 33d, and the corresponding connection pads of the printed circuit board.

The first, the second, the third, and the fourth electrode surfaces 33a, 33b, 33c, and 33d are mounting surfaces on the printed circuit board. That is, the aforementioned chip scale package 30 is turned at an angle of 180 degrees, and the turned chip scale package 30 is then mounted on the printed circuit board so that the first, the second, the third, and the fourth electrode surfaces 33a, 33b, 33c, and 33d are connected to the corresponding connection pads of the printed circuit board.

An oxidation layer may be formed on the exposed surfaces of the first, the second, the third, and fourth conductive layers 31a, 31b, 31c, and 31d by a natural oxidation. Herein, the exposed surfaces are the side surfaces of the first, the second, the third, and fourth conductive layers 31a, 31b, 31c, and 31d (In some cases, the exposed surfaces may be parts of the upper surfaces of the first, the second, the third, and fourth conductive layers 31a, 31b, 31c, and 31d, in which the electrode surfaces are not formed.) These oxidation layers serve as layers for protecting the first, the second, the third, and the fourth conductive layers 31a, 31b, 31c, and 31d from oxidizing, thereby assuring the reliability of the first, the second, the third, and the fourth conductive layers 31a, 31b, 31c, and 31d. However, in order to prevent the first, the second, the third, and the fourth conductive layers 31a, 31b, 31c, and 31d from seriously oxidizing, a passivation layer 39 may be formed on the first, the second, the third, and the fourth conductive layers 31a, 31b, 31c, and 31d except for the surfaces provided with the first, the second, the third, and the fourth electrode surfaces 33a, 33b, 33c, and 33d.

Preferably, the passivation layer 39 is an insulation film formed by coating insulating resin. If necessary, the passivation layer 39 may be formed on the exposed side surfaces of the chip 35.

Figure 4:
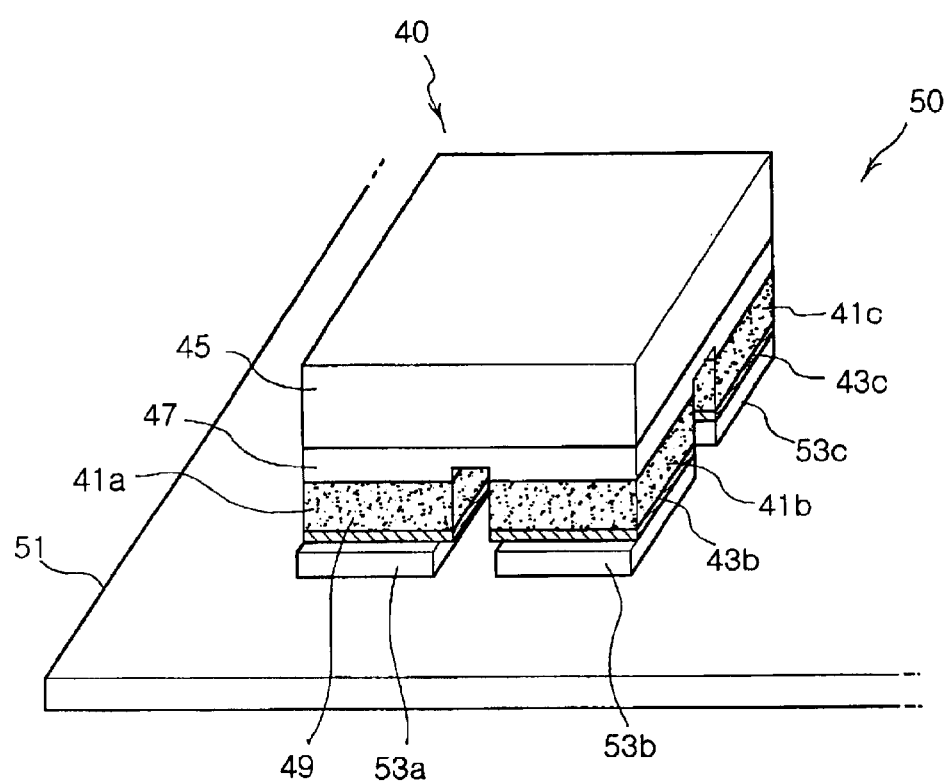
FIG. 4 is a perspective view of a chip scale package assembly, in which a chip scale package is mounted on a printed circuit board in accordance with the preferred embodiment of the present invention.

FIG. 4 is a perspective view of a chip package assembly 50, in which a chip scale package 40 is mounted on a printed circuit board 51 in accordance with the preferred embodiment of the present invention.

As shown in FIG. 4, the chip package assembly 50 comprises the chip scale package 40 and the printed circuit board 51 for mounting the chip scale package 40. As shown in FIGS. 3a and 3b, in the chip scale package 40, an insulating layer 47 is formed on the upper surface of a chip 45. Four conductive layers, i.e., the first, the second, and the third conductive layers 41a, 41b, and 41c (the fourth conductive layer is not shown) are formed on the upper surface of the insulating layer 47. The first, the second, and the third conductive layers 41a, 41b, and 41c (the fourth conductive layer is not shown) are connected to each of the terminals. Four electrode surfaces. i.e., the first, the second, and the third electrode surfaces 43a, 43b, and 43c (the fourth electrode surface is not shown) are formed on each of the upper surfaces of the first, the second, and the third conductive layers 41a, 41b, and 41c (the fourth conductive layer is not shown).

The chip scale package 40 is mounted on the printed circuit board 51 by disposing the first, the second, and the third electrode surfaces 43a, 43b, and 43c (the fourth electrode surface is not shown) on corresponding connection pads 53a, 53b, and 53c (the rest one is not shown) of the printed circuit board 51 and by performing the soldering between the first, the second, and the third electrode surfaces 43a, 43b, and 43c (the fourth electrode surface is not shown), and the connection pads 53a, 53b, and 53c (the rest one is not shown), thereby completing the fabrication of the chip package assembly 50 of FIG. 4.

Designated circuits (not shown) formed on the printed circuit board 51 are electrically connected to each terminal of the chip 45 via the first, the second, and the third conductive layers 41a, 41b, and 41c (the fourth conductive layer is not shown) provided with the first, the second, and the third electrode surfaces 43a, 43b, and 43c (the fourth electrode surface is not shown).

Further, the present invention provides a method of fabricating the aforementioned chip scale package. FIGS. 5a through 5f are perspective views illustrating each step of the method of fabricating the chip scale package in accordance with a preferred embodiment of the present invention.

Figure 5A:
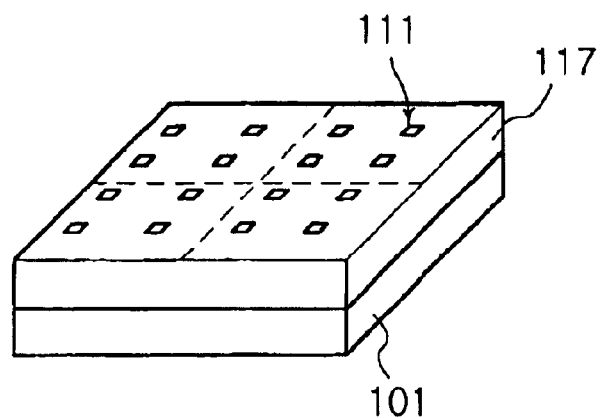
FIGS. 5a through 5f are perspective views illustrating each step of a method of fabricating the chip scale package in accordance with a preferred embodiment of the present invention.

First, as shown in FIG. 5a, a wafer 101 including a plurality of chips is prepared. Herein, each chip is divided by a dotted line of the upper surface of the wafer 101. Terminals 111 are formed on the upper surface of the wafer 101. An insulating layer 117 is formed on the upper surface of the wafer 101 except for areas for forming the terminals 111. As described above, each chip of the wafer 101 comprises four terminals on its upper surface. FIG. 5a partially shows the wafer 101. However, the whole structure of the wafer 105 with a plurality of the chips and with a predetermined diameter will be apparent to those skilled in the art.

Figure 5B:
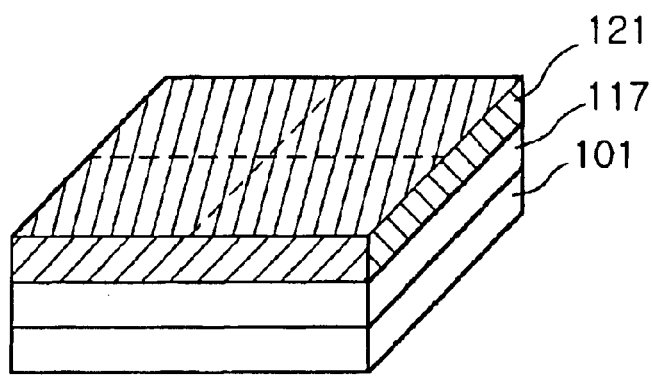

As shown in FIG. 5b, a conductive layer 121 is formed on the upper surface of the insulating layer 117 of the wafer 101. Herein, the conductive layer 121 is formed on the upper surface of the insulating layer 117 so that the conductive layer 121 is connected to the exposed four terminals 111. Therefore, preferably, the conductive layer 121 is formed by a plating method. However, as described above, most preferably, the conductive layer 121 is formed by forming a plating layer in order to fill the areas without the insulating layer 117 and then by stacking at least one copper layer on the plating layer. The conductive layer 121 may be made of copper (Cu).

Figure 5C:
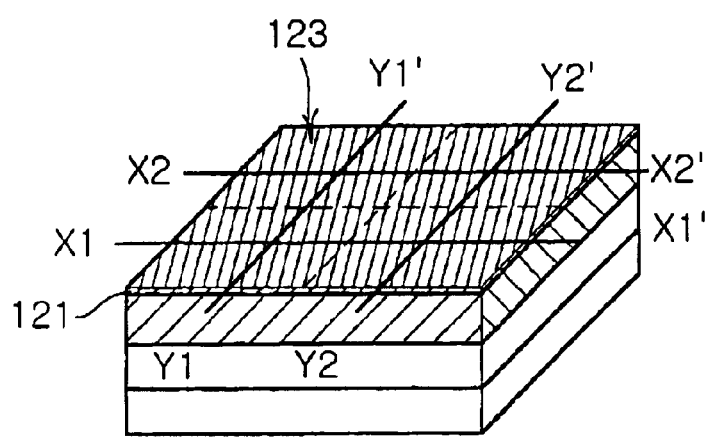

Then, as shown in FIG. 5c, an electrode surface 123 is formed on the upper surface of the conductive layer 121. The electrode surface 123 is a comparative thin layer made of metal including gold (Au) with an excellent electric conductivity as so to subsequently perform the soldering. The electrode surface 123 is easily formed by an electroplating method. After forming the electrode surface 123, parts of the conductive layer 121 are removed along the lines of X1—X1', X2—X2', Y1—Y1', and Y2—Y2' of FIG. 5c, thereby dividing the conductive layer 121 having the electrode surface 123 in plural parts.

Figure 5D:
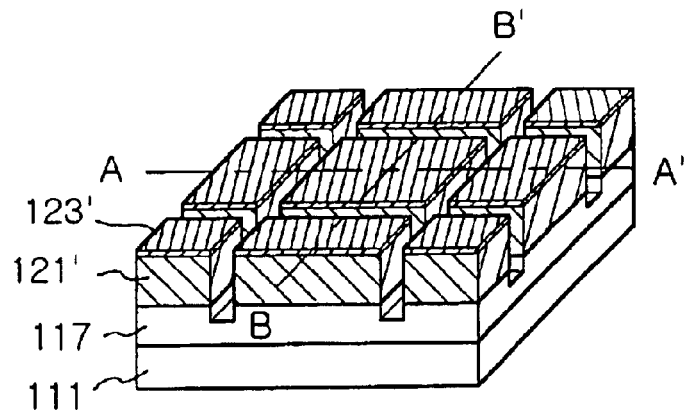

Therefore, as shown in FIG. 5d, the conductive layer 121 having the electrode surface 123 is divided into a plurality of conductive units 121', which are connected to each of the corresponding terminals, respectively. The conductive unit 121' serves as a terminal part connected to each corresponding terminal. The division of the conductive 12 into plural conductive units 121' can be easily performed by a dicing step, in which a cutting depth of a blade is controlled. The cutting depth is set to be more than the thickness of the conductive layer 121, but not to be reached to the chip. Herein, the insulating layer 117 under the conductive layer 121 serves to prevent the chip from being damaged from the division of the conductive layer 121.

Figure 5E:
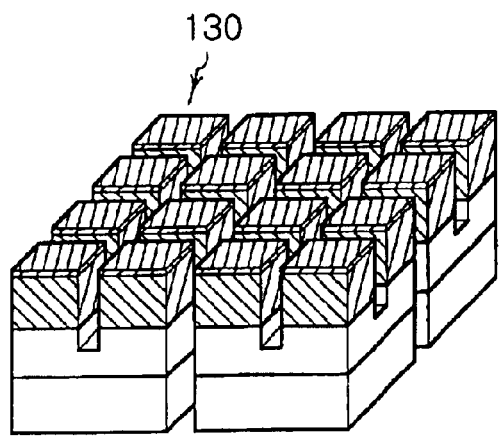

Then, as shown in FIG. 5d, the wafer 101 is diced into a plurality of package units by cutting the wafer 101 along the lines A-A' and B-B', thereby obtaining a plurality of chip scale packages 130 as shown in FIG. 5e. The dicing step of the wafer 101 into a plurality of the packages 130 can be achieved simultaneously with the step of dividing the conductive layer 121 by controlling the cutting depth.

Figure 5F:
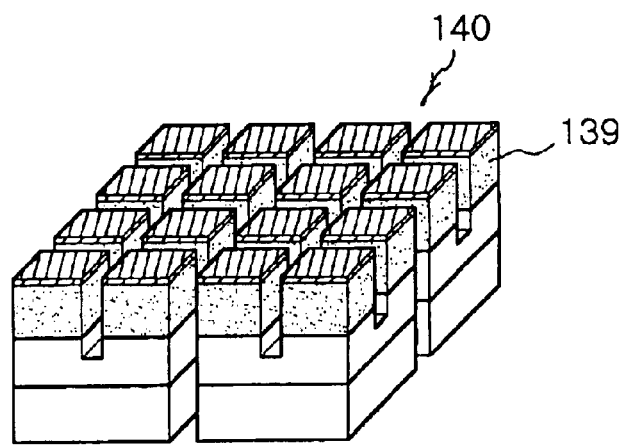

As shown in FIG. 5f, a passivation layer 139 may be further formed on the exposed surfaces of the conductive layers 121' except for the electrode surfaces 123'. The passivation layer 139 is made of an insulating film formed by coating insulating resin on the conductive layer 121'. The passivation layer 139 serves to prevent the conductive layer 121' from oxidizing, thereby improving the reliability of the chip scale package 140. If necessary, the passivation layer 139 may be omitted according to the working condition of the chip scale package 140.

In accordance with the present invention, the miniaturized chip scale package is fabricated by a series of steps of processing its one surface having a plurality of terminals. Further, the chip scale package of the present invention may be variously modified within the scope and spirit of the invention. That is, although the aforementioned preferred embodiment of the present invention discloses a chip having four terminals on its one surface, if the terminals are formed on one surface of the chip, the number and the alignment of terminals of the chip may be widely modified or improved.

As apparent from the above description, the present invention provides a chip scale package, which is miniaturized and more easily fabricated, by forming an conductive layer on one surface of the chip so as to be connected each of terminals of the surface of the chip and by forming an electrode surface on the upper surface of the conductive layer, thereby improving the reliability of the package. Further, the present invention provides a method for fabricating the chip scale package, in which the conventional wire bonding step or via hole forming step are omitted, thereby simplifying the fabrication process and reducing the fabrication cost.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of fabricating a chip scale package, said method comprising the steps of:
   preparing a wafer including a plurality of chips, each chip including a plurality of terminals on an upper surface of said wafer;
   forming an insulating layer on the upper surface of the wafer except for the terminals;
   forming a conductive layer on the upper surface of the insulating layer so as to be connected to the terminals;
   forming an electrode surface layer on the upper surface of the conductive layer;
   dividing the conductive layer and the electrode surface layer formed on the insulating layer so as to electrically separate the terminals within each of the chips; and
   dicing the wafer into a plurality of chip scale package units wherein the steps are performed in the order given.

2. The method of claim 1, further comprising the step of forming passivation layers on the exposed surfaces of the conductive layer except for the upper surface having the electrode surface layer, after dicing the wafer into the chip scale package units.

3. The method of claim 2, wherein said passivation layers are made of insulating films formed by coating insulation resin.

4. The method of claim 1, wherein the step of dividing the conductive layer and the electrode surface layer is performed simultaneously with the step of dicing the wafer into the chin scale package units by controlling a cutting depth.

5. The method of claim 1, wherein the conductive layer is formed by a plating method.

6. The method of claim 1, wherein the conductive layer is a metal layer including copper (Cu).

7. The method of claim 1, wherein the electrode surface layer is a metal layer including gold (Au).

8. The method of claim 1, wherein the step of forming the conductive layer comprises forming a metal layer using a plating method and stacking at least one copper layer on the metal layer.

9. The method of claim 1, wherein the electrode surface layer is formed by a plating method.

10. The method of claim 1, wherein each of the chips is an integrated circuit chip.

11. The method of claim 1, wherein the step of dividing the conductive layer and the electrode surface layer comprises partially removing the insulating layer.

12. The method of claim 1, wherein the step of dicing the wafer comprises cutting through said conductive layer.

13. A method of fabricating a chip scale package, said method comprising the steps of:
   preparing a wafer including a plurality of chips, each chip including a plurality of terminals an upper surface of the water;
   forming an insulating layer on the upper surface of the wafer so as the terminals are exposed through openings in the insulating layer;
   forming a conductive layer on the insulating layer so as to be connected to the terminals;
   forming an electrode layer on the conductive layer;
   dividing the conductive layer into multiple parts each connected to one of the terminals; and
   dicing the wafer into a plurality of chip scale package units;
   wherein the step of dividing the conductive layer into multiple parts is performed simultaneously with the step of dicing the wafer into the chip scale package units.

14. A method of fabricating a chip scale package, said method comprising the steps of:
   a) preparing a wafer including a plurality of chips, each chip including a plurality of terminals on an upper surface of the wafer;
   b) forming an insulating layer on the upper surface of the wafer so as the terminals are exposed through openings in the insulating layer;
   c) forming a conductive layer on the insulating layer and in the openings so as to be connected to at least two of said terminals of said chips;
   d) forming an electrode layer on the conductive layer;
   e) dicing the conductive layer so as to electrically separate said at least two terminals; and
   f) dicing the wafer into a plurality of chip scale package units wherein the steps are performed in the order given.

15. The method of claim 14, wherein
   in step c), said conductive layer is formed so as to be electrically connected to the terminals of one of said chips; and
   in step e), said conductive layer is diced so as to electrically separate said terminals of said one chip.

16. The method of claim 14, wherein
   in step c), said conductive layer is formed so as to be electrically connected to the terminals of two of said chips; and
   in step e), said conductive layer is diced so as to electrically separate the terminals of each of said two chips, leaving at least one terminal of one of said two chips electrically connected to at least one terminal of the other of said two chips.

17. The method of claim 16, wherein the terminals that remain electrically connected by said conductive layer after step e) are electrically separated by step f).

18. The method of claim 14, wherein steps e) and f) are performed simultaneously.

19. The method of claim 14, wherein step e) comprises cutting through the electrode layer.

20. The method of claim 14, wherein step e) comprises partially cutting the insulating layer without cutting the wafer.

21. The method of claim 14, wherein step f) comprises cutting through said conductive layer.

* * * * *